(12) United States Patent
Okabe et al.

(10) Patent No.: US 12,550,582 B2
(45) Date of Patent: Feb. 10, 2026

(54) DISPLAY DEVICE

(71) Applicant: Sharp Display Technology Corporation, Kameyama (JP)

(72) Inventors: Tohru Okabe, Kameyama (JP); Shoji Okazaki, Kameyama (JP); Shinsuke Saida, Kameyama (JP); Shinji Ichikawa, Kameyama (JP); Hiroki Taniyama, Kameyama (JP); Eiji Fujimoto, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 383 days.

(21) Appl. No.: 18/280,942

(22) PCT Filed: Apr. 27, 2021

(86) PCT No.: PCT/JP2021/016828
§ 371 (c)(1),
(2) Date: Sep. 7, 2023

(87) PCT Pub. No.: WO2022/230060
PCT Pub. Date: Nov. 3, 2022

(65) Prior Publication Data
US 2024/0147789 A1    May 2, 2024

(51) Int. Cl.
*H10K 59/80* (2023.01)
*H10K 50/00* (2023.01)
(Continued)

(52) U.S. Cl.
CPC ....... *H10K 59/80515* (2023.02); *H10K 50/00* (2023.02); *H10K 59/00* (2023.02);
(Continued)

(58) Field of Classification Search
CPC .. H10K 59/80515; H10K 50/00; H10K 59/00; H10K 59/124; H10K 59/131;
(Continued)

(56) References Cited

U.S. PATENT DOCUMENTS 9,859,346 B2 * 1/2018 Seo ............... H10K 59/122
10,355,061 B2 * 7/2019 Yeo ............... H10K 59/1213
(Continued)

FOREIGN PATENT DOCUMENTS

JP    2010-287543 A    12/2010
JP    2011-113815 A     6/2011
(Continued)

*Primary Examiner* — Mohammed Shamsuzzaman
(74) *Attorney, Agent, or Firm* — ScienBiziP, P.C.

(57) ABSTRACT

A display device, includes: a base substrate layer; a thin-film transistor layer provided on the base substrate layer, and including a plurality of subpixels forming a display region, each of the subpixels being provided with a thin-film transistor on which a planarization film is stacked; and a light-emitting element layer provided on the thin-film transistor layer, and including a plurality of first electrodes, a common edge cover, a plurality of light-emitting functional layers, and a common second electrode, all of which are sequentially stacked on top of another in association with the plurality of subpixels, wherein each of the first electrodes has a peripheral edge portion provided to: surround, in plan view, the thin-film transistor corresponding to the first electrode; and protrude toward the base substrate layer.

11 Claims, 7 Drawing Sheets

(51) Int. Cl.
  *H10K 59/00* (2023.01)
  *H10K 59/124* (2023.01)
  *H10K 59/131* (2023.01)
(52) U.S. Cl.
  CPC ......... *H10K 59/124* (2023.02); *H10K 59/131* (2023.02); *H10K 59/8731* (2023.02)
(58) Field of Classification Search
  CPC ...... H10K 59/8731; G09F 9/30; H05B 33/02; H05B 33/04; H05B 33/12; H05B 33/22; H05B 33/26
  See application file for complete search history.

(56) References Cited

U.S. PATENT DOCUMENTS

| | | | |
|---|---|---|---|
| 2017/0077195 A1* | 3/2017 | Seo | H10K 59/122 |
| 2017/0269762 A1 | 9/2017 | Xu et al. | |
| 2018/0090068 A1* | 3/2018 | Ogawa | G09G 3/2074 |
| 2019/0073951 A1* | 3/2019 | Ogawa | G02F 1/1343 |
| 2021/0288286 A1* | 9/2021 | Okabe | H10K 59/131 |
| 2022/0115475 A1 | 4/2022 | Gunji et al. | |
| 2022/0181399 A1* | 6/2022 | Shim | H10K 59/122 |
| 2022/0216288 A1* | 7/2022 | Okabe | H05B 33/04 |
| 2023/0077957 A1* | 3/2023 | Okabe | H10K 59/8731 |
| | | | 257/40 |
| 2023/0337486 A1* | 10/2023 | Okabe | H10K 59/131 |

FOREIGN PATENT DOCUMENTS

| | | | |
|---|---|---|---|
| JP | 2018-054728 A | 4/2018 | |
| WO | 2017045133 A1 | 3/2017 | |
| WO | 2020066020 A1 | 4/2020 | |
| WO | 2020194706 A1 | 10/2020 | |

* cited by examiner

FIG. 7

DISPLAY DEVICE

TECHNICAL FIELD

The disclosure relates to a display device.

BACKGROUND ART

Light-emitting organic electroluminescence (EL) display devices using organic EL elements have attracted attention as a replacement for liquid crystal display devices.

For example, Patent Document 1 discloses an organic EL display device including: a gate insulating film; a passivation film; an overcoat film; an anode film; an organic film; and a cathode film sequentially stacked on top of another on a glass substrate.

CITATION LIST

Patent Literature
[Patent Document 1] International Publication No. WO2017/045133

SUMMARY

Technical Problem

An organic EL display device is provided with a plurality of thin-film transistor (hereinafter also referred to as "TFT") for each of subpixels; that is, a minimum unit of an image. Here, examples of a well-known semiconductor layer constituting the TFT include: a semiconductor layer made of polysilicon having high mobility; and a semiconductor layer made of oxide semiconductor such as In—Ga—Zn—O and generating a low leakage current. An organic EL display device proposed in recent years has a hybrid structure in which a TFT formed of polysilicon and a TFT formed of oxide semiconductor are provided to each of the subpixels. However, the TFT formed of oxide semiconductor is more susceptible to light than the TFT formed of polysilicon. Such an organic EL display device has room for improvement.

The disclosure is conceived in view of the above problem, and intended to reduce light incident on a TFT.

Solution to Problem

In order to achieve the above object, a display device according to the disclosure includes: a base substrate layer; and a light-emitting element layer provided on the thin-film transistor layer, and including a plurality of first electrodes, a common edge cover, a plurality of light-emitting functional layers, and a common second electrode, all of which are sequentially stacked on top of another in association with the plurality of subpixels. Each of the first electrodes has a peripheral edge portion provided to: surround, in plan view, the thin-film transistor corresponding to the first electrode; and protrude toward the base substrate layer.

Advantageous Effect of Disclosure

The disclosure can reduce light incident on a TFT.

BRIEF DESCRIPTION OF DRAWINGS

FIG. 6 corresponds to FIG. 3.

FIG. 7 corresponds to FIG. 3.

DESCRIPTION OF EMBODIMENTS

Embodiments of the disclosure will be described in detail below with reference to the drawings. Note that the disclosure shall not be limited to the embodiments below.

First Embodiment

Figure 1:
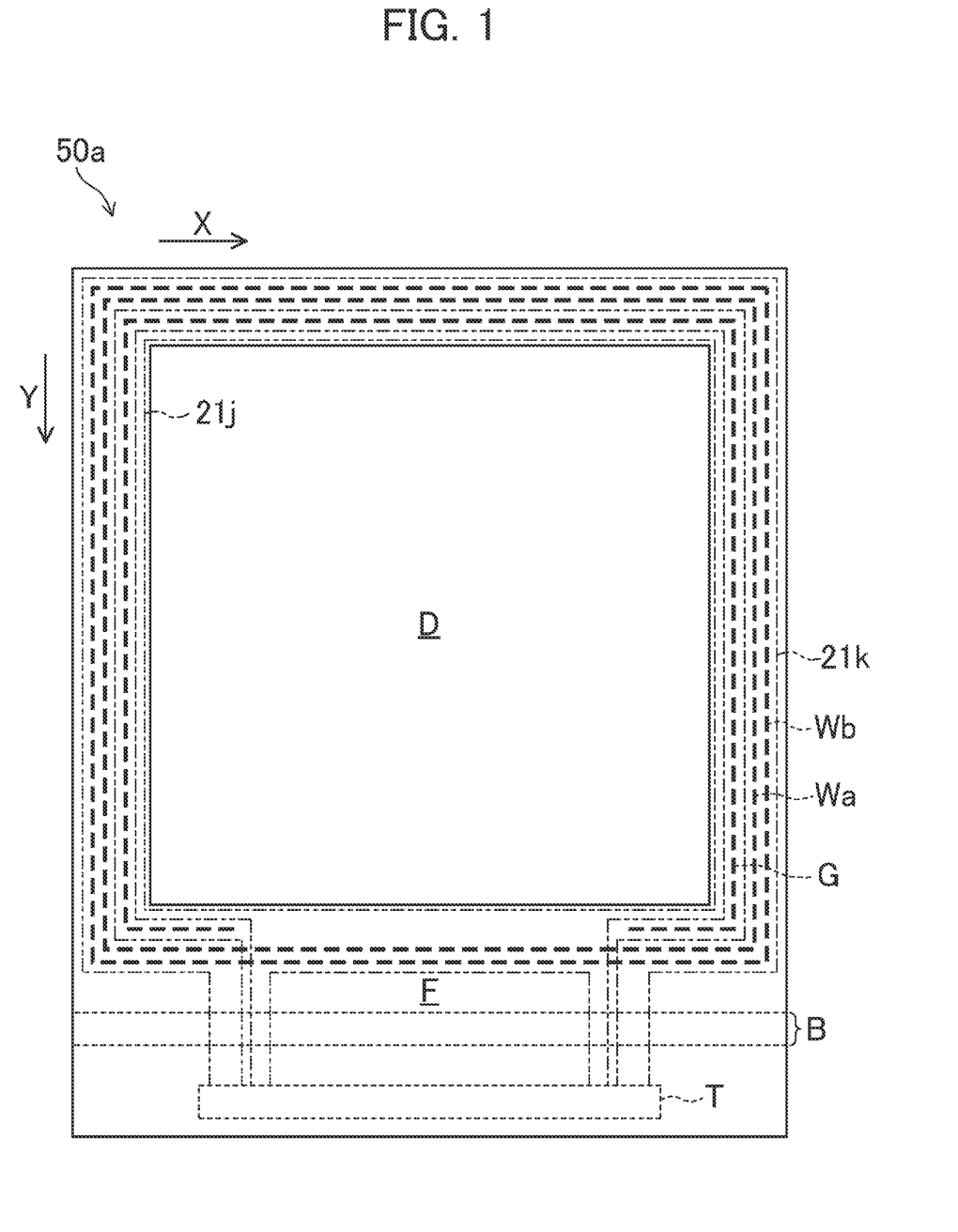
FIG. 1 is a plan view of a schematic configuration of an organic EL display device according to a first embodiment of the disclosure.
Figure 2:
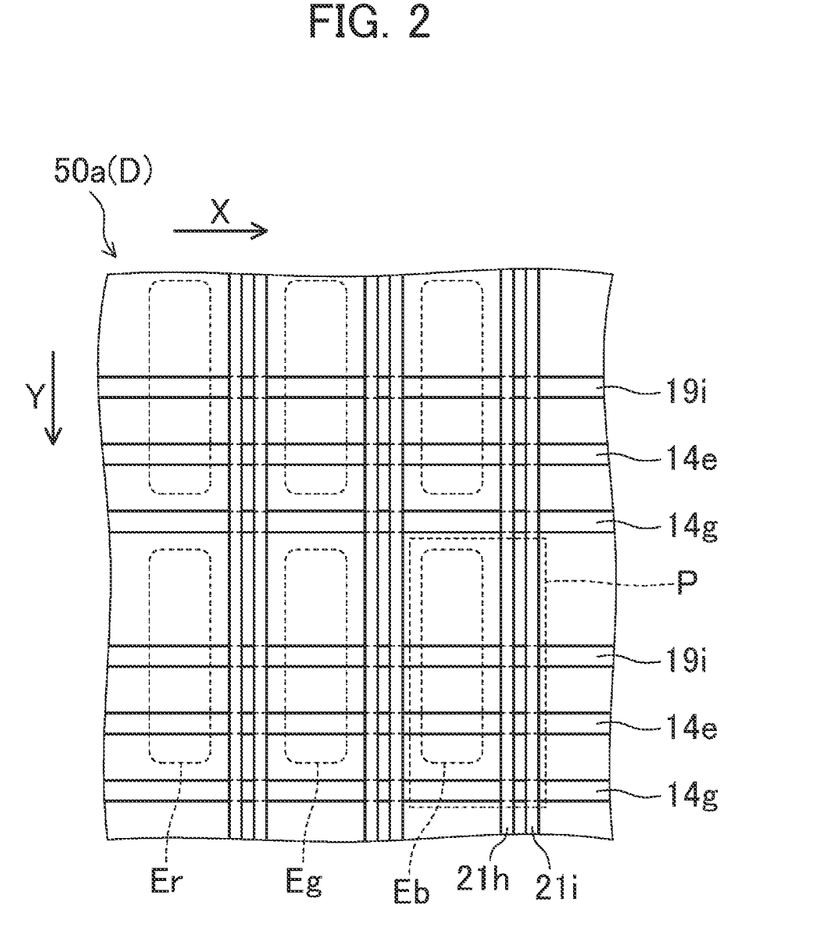
FIG. 2 is a plan view of a display region of the organic EL display device according to the first embodiment of the disclosure.
Figure 3:
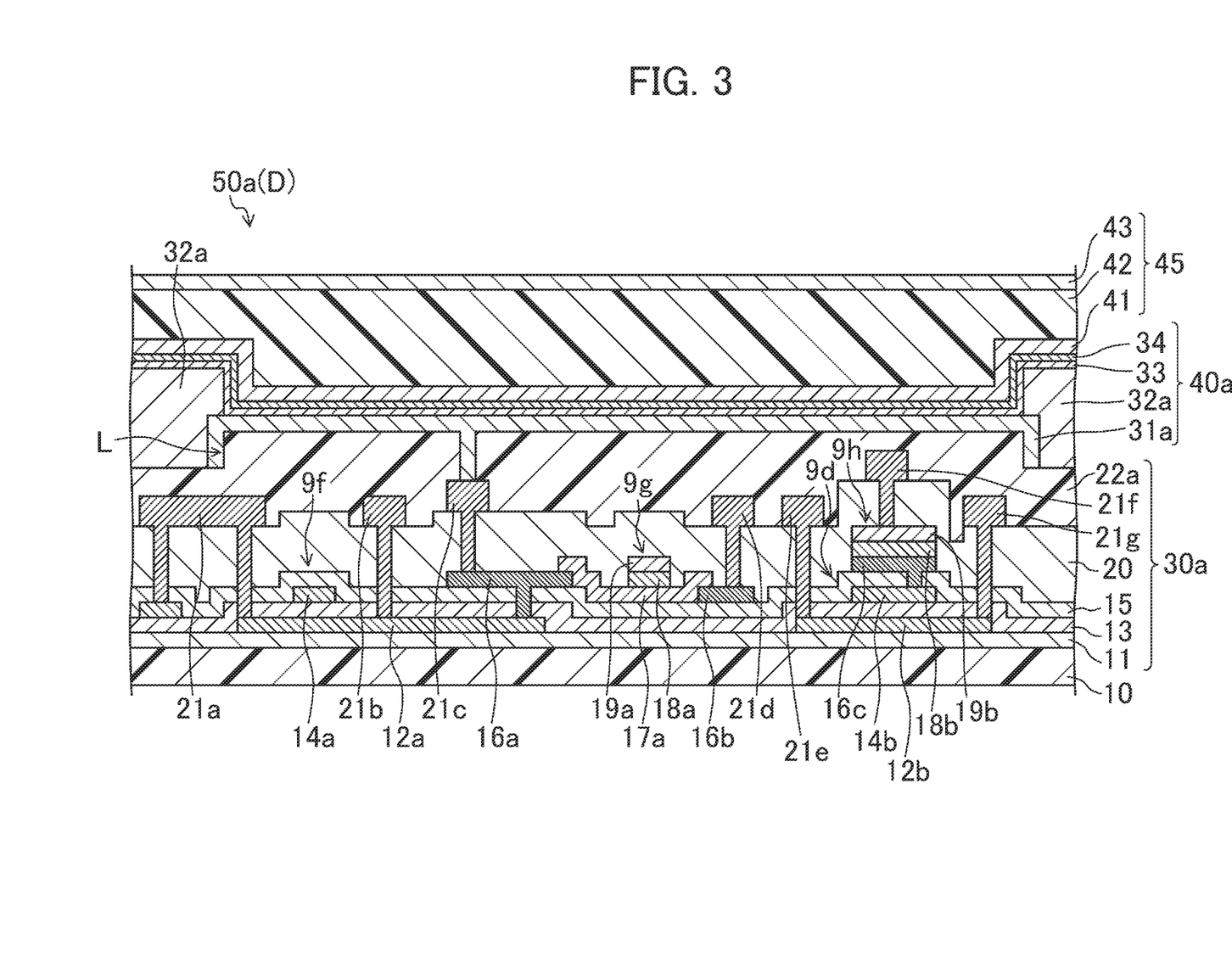
FIG. 3 is a cross-sectional view of the display region of the organic EL display device according to the first embodiment of the disclosure.
Figure 4:
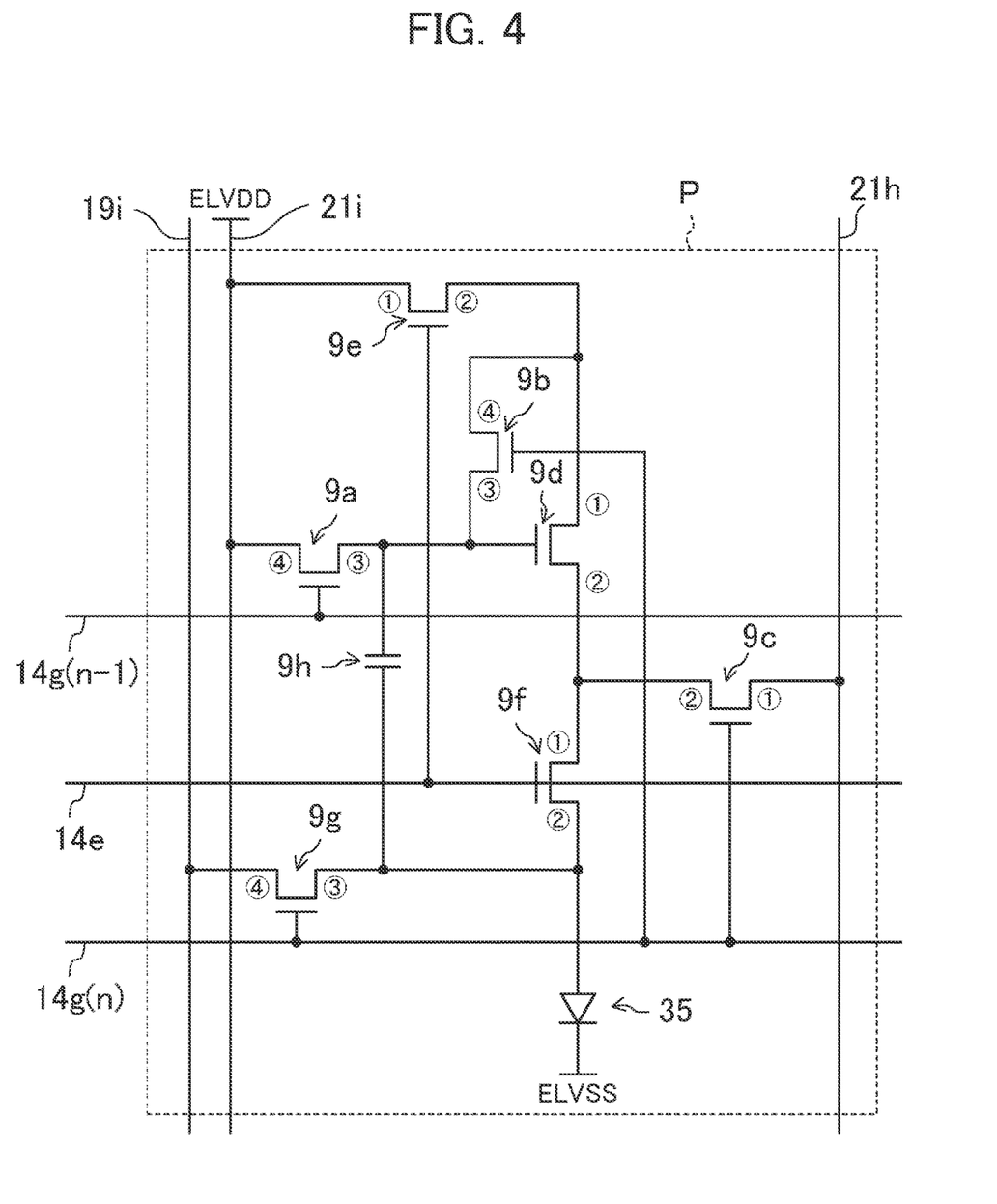
FIG. 4 is an equivalent circuit diagram illustrating a pixel circuit of the organic EL display device according to the first embodiment of the disclosure.
Figure 5:
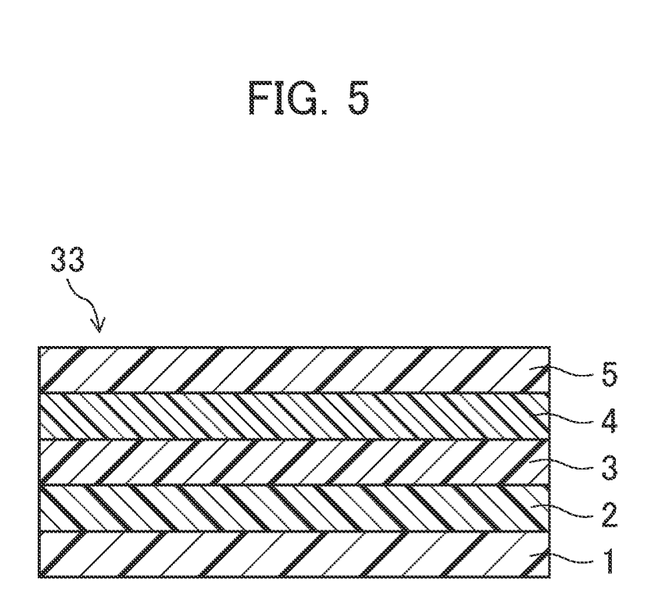
FIG. 5 is a cross-sectional view of an organic EL layer included in the organic EL display device according to the first embodiment of the disclosure.

FIGS. 1 to 5 illustrate a first embodiment of a display device according to the disclosure. Note that, in the embodiments below, an organic EL display device including an organic EL element layer is exemplified as a display device including a light-emitting element layer. Here, FIG. 1 is a plan view of a schematic configuration of an organic EL display device 50a according to this embodiment. Furthermore, FIG. 2 and FIG. 3 are respectively a plan view and a cross-sectional view of a display region D of the organic EL display device 50a. Moreover, FIG. 4 is an equivalent circuit diagram illustrating a pixel circuit of the organic EL display device 50a. In addition, FIG. 5 is a cross-sectional view of an organic EL layer 33 included in the organic EL display device 50a.

As illustrated in FIG. 1, the organic EL display device 50a includes, for example: the display region D shaped into a rectangle and displaying an image; and a picture-frame region F shaped into a picture frame and provided around the display region D. Note that this embodiment exemplifies the display region D shaped into a rectangle. Examples of the rectangle include such substantial rectangles as a rectangle having arc-like sides, a rectangle having rounded corners, and a rectangle having partially notched sides.

The display region D illustrated in FIG. 2 includes a plurality of subpixels P arranged in a matrix. Moreover, in the display region D, as illustrated in FIG. 2, for example, subpixels P having red light-emitting regions Er for presenting red, subpixels P having green light-emitting regions Eg for presenting green, and subpixels P having blue light-emitting regions Eb for presenting blue are provided side by side. Note that, in the display region D, for example, neighboring three subpixels P each having one of a red light-emitting region Er, a green light-emitting region Eg, and a blue light-emitting region Eb constitute one pixel.

The picture-frame region F in FIG. 1 has a lower end portion provided with a terminal unit T extending in one direction (in an X-direction in the drawing). Moreover, as illustrated in FIG. 1, the picture-frame region F includes a folding portion B between the display region D and the terminal unit T. The folding portion B, extending in one direction (in the X-direction in the drawing), is foldable around a folding axis in the X-direction in the drawing at an angle of 180° (foldable in a U-shape). Furthermore, the picture-frame region F includes a planarization film 22a to be described later. As illustrated in FIG. 1, the planarization film 22a is provided with a trench G shaped into a substantial C-shape in plan view and penetrating the planarization film 22a. Here, as illustrated in FIG. 1, the trench G is shaped into a substantial C-shape and provided to open toward the terminal unit T in plan view.

In addition, as illustrated in FIG. 3, the organic EL display device 50a includes: a resin substrate layer 10 serving as a base substrate layer; a TFT layer 30a provided on the resin substrate layer 10; an organic EL element layer 40a provided on the TFT layer 30a and serving as a light-emitting element layer; and a sealing film 45 provided to cover the organic EL element layer 40a.

The resin substrate layer 10 is made of, for example, such a material as polyimide.

The TFT layer 30a, as illustrated in FIG. 3, includes: a base coat film 11 provided on the resin substrate layer 10; an initialization TFT 9a (see FIG. 4), a compensation TFT 9b (see FIG. 4), a write TFT 9c (see FIG. 4), a drive TFT 9d, a power supply TFT 9e (see FIG. 4), an light-emission control TFT 9f, an anode discharge TFT 9g, and a capacitor 9h, all of which are arranged on the base coat film 11 for each subpixel P; and the planarization film 22a stacked on the TFTs 9a to 9g and the capacitor 9h. Here, the TFT layer 30a includes, as illustrated in FIG. 2, a plurality of gate lines 14g extending in parallel with one another in the X-direction in the drawing. Furthermore, the TFT layer 30a includes, as illustrated in FIG. 2, a plurality of light-emission control lines 14e extending in parallel with one another in the X-direction in the drawing. Moreover, the TFT layer 30a includes, as illustrated in FIG. 2, a plurality of second initialization power supply lines 19i extending in parallel with one another in the X-direction in the drawing. Note that, as illustrated in FIG. 2, the light-emission control lines 14e are provided side-by-side with the gate lines 14g and the second initialization power supply lines 19i. In addition, the TFT layer 30a includes, as illustrated in FIG. 2, a plurality of source lines 21h extending in parallel with one another in a Y-direction in the drawing. Furthermore, the TFT layer 30a includes, as illustrated in FIG. 2, a plurality of power supply lines 21i extending in parallel with one another in the Y-direction in the drawing. Note that, as illustrated in FIG. 2, the power supply lines 21i and the source lines 21h are provided side by side.

Each of the write TFT 9c, the drive TFT 9d, the power supply TFT 9e, and the light-emission control TFT 9f is provided as a first TFT having a first semiconductor layer formed of polysilicon such as low temperature polysilicon (LTPS). The first TFT includes: a gate electrode; a first terminal electrode; and a second terminal electrode. Furthermore, each of the initialization TFT 9a, the compensation TFT 9b, and the anode discharge TFT 9g is provided as a second TFT having a second semiconductor layer formed of, for example, an In—Ga—Zn—O-based oxide semiconductor. The second TFT includes: a gate electrode; a third terminal electrode; and a fourth terminal electrode. Here, the In—Ga—Zn—O-based oxide semiconductor is a ternary oxide of indium (In), gallium (Ga), and zinc (Zn), and a ratio (a composition ratio) of In to Ga to Zn is not limited to a particular ratio. Furthermore, the In—Ga—Zn—O-based semiconductor may be amorphous or crystalline. Note that the crystalline In—Ga—Zn—O-based semiconductor is preferably a crystalline In—Ga—Zn—O-based semiconductor in which the c-axis is oriented substantially perpendicular to the layer plane. Moreover, instead of the In—Ga—Zn—O-based semiconductor, the second semiconductor layer may contain another oxide semiconductor. Examples of the other oxide semiconductor may include an In—Sn—Zn—O-based semiconductor (for example, $In_2O_3$—$SnO_2$—ZnO; InSnZnO). Here, the In—Sn—Zn—O-based semiconductor is a ternary oxide of indium (In), tin (Sn), and zinc (Zn). In addition, other oxide semiconductors may include: an In—Al—Zn—O-based semiconductor; an In—Al—Sn—Zn—O-based semiconductor; a Zn—O-based semiconductor; an In—Zn—O-based semiconductor; a Zn—Ti—O-based semiconductor; a Cd—Ge—O-based semiconductor; a Cd—Pb—O-based semiconductor; cadmium oxide (CdO); a Mg—Zn—O-based semiconductor; an In—Ga—Sn—O-based semiconductor; an In—Ga—O-based semiconductor; a Zr—In—Zn—O-based semiconductor; a Hf—In—Zn—O-based semiconductor; an Al—Ga—Zn—O-based semiconductor; a Ga—Zn—O-based semiconductor; an In—Ga—Zn—Sn—O-based semiconductor; $InGaO_3(ZnO)_5$; zinc magnesium oxide ($Mg_xZn_{1-x}O$), and zinc cadmium oxide ($Cd_xZn_{1-x}O$). Note that the Zn—O-based semiconductor may be ZnO doped with one or more kinds of impurity elements among a group 1 element, a group 13 element, a group 14 element, a group 15 element, and a group 17 element. The Zn—O-based semiconductor may be in an amorphous state, in a polycrystalline state, or in a microcrystalline state in which an amorphous state and a polycrystalline state are mixed together. Alternatively, the Zn—O-based semiconductor does not have to be doped with any impurity element.

As illustrated in FIG. 4, in each subpixel P, the initialization TFT 9a has: a gate electrode electrically connected to a gate line 14g (n−1) of the preceding stage (the n−1 stage); a third terminal electrode electrically connected to a lower conductive layer 16c of the capacitor 9h to be described later and a gate electrode of the drive TFT 9d; and a fourth terminal electrode electrically connected to a power supply line 21i. Note that, in the equivalent circuit diagram of FIG. 4, each of the first TFTs (the write TFT 9c, the drive TFT 9d, the power supply TFT 9e, and the light-emission control TFT 9f) has the first terminal electrode and the second terminal electrode denoted respectively with the numeral 1 and the numeral 2. Each of the second TFTs (the initialization TFT 9a, the compensation TFT 9b, and the anode discharge TFT 9g) has the third terminal electrode and the fourth terminal electrode denoted respectively with the numeral 3 and the numeral 4. Furthermore, the equivalent circuit diagram of FIG. 4 illustrates a pixel circuit of a subpixel P at the n-th row and the m-th column. The equivalent circuit diagram also partially includes a pixel circuit of a subpixel P at the (n−1)-th row and the m-th column. Moreover, in the equivalent circuit diagram of FIG. 4, the power supply line 21i to supply a high power supply voltage ELVDD also serves as a first initialization power supply line; however, the power supply line 21i and the first initialization power supply line may be provided separately. In addition, the second initialization power supply line 20i receives, but not limited to, the same voltage as a low power-supply voltage ELVSS. The second initialization power supply line 20i may receive a voltage that differs from the low power-supply voltage ELVSS, and that turns OFF an organic EL element 35.

As illustrated in FIG. 4, in each subpixel P, the compensation TFT 9b has: a gate electrode electrically connected to a gate line 14g (n) in a corresponding stage (n-th stage); the third terminal electrode electrically connected to the gate electrode of the drive TFT 9d; and the fourth terminal electrode electrically connected to the first terminal electrode of the drive TFT 9d.

As illustrated in FIG. 4, in each subpixel P, the write TFT 9c has: a gate electrode electrically connected to the gate line 14g (n) in the corresponding stage (n-th stage); the first terminal electrode electrically connected to a corresponding source line 21h; and the second terminal electrode electrically connected to the second terminal electrode of the drive TFT 9d.

As illustrated in FIG. 4, in each subpixel P, the drive TFT 9d has: a gate electrode 14b (see FIG. 3) electrically connected to the third terminal electrode of each of the initialization TFT 9a and the compensation TFT 9b; a first terminal electrode 21e (see FIG. 3) electrically connected to the fourth terminal electrode of the compensation TFT 9b and to the second terminal electrode of the power supply TFT 9e; and a second terminal electrode 21g (see FIG. 3) electrically connected to the second terminal electrode of the write TFT 9c and to the first terminal electrode of the light-emission control TFT 9f. Here, the drive TFT 9d controls a current of the organic EL element 35. Furthermore, as illustrated in FIG. 3, the drive TFT 9d includes: a first semiconductor layer 12b provided on the base coat film 11; a first gate insulating film 13 provided on the first semiconductor layer 12b; a gate electrode 14b provided on the first gate insulating film 13; a first interlayer insulating film 15 and a second interlayer insulating film 20 provided to cover the gate electrode 14b; and the first terminal electrode 21e and the second terminal electrode 21g provided on the second interlayer insulating film 20 and spaced apart from each other. Here, the first semiconductor layer 12b includes: a first conductor region and a second conductor region spaced apart from each other; and a first channel region defined between the first conductor region and the second conductor region. Moreover, as illustrated in FIG. 3, the first terminal electrode 21e and the second terminal electrode 21g are respectively and electrically connected to the first conductor region and the second conductor region of the first semiconductor layer 12b through two contact holes formed in a multilayer film including the first gate insulating film 13, the first interlayer insulating film 15, and the second interlayer insulating film 20.

As illustrated in FIG. 4, in each subpixel P, the power supply TFT 9e has: a gate electrode electrically connected to a light-emission control line 14e in the corresponding stage (n-th stage); the first terminal electrode electrically connected to the power supply line 21i; and the second terminal electrode electrically connected to the first terminal electrode of the drive TFT 9d.

As illustrated in FIG. 4, in each subpixel P, the light-emission control TFT 9f has: a gate electrode 14a electrically connected to the light-emission control line 14e in the corresponding stage (n-th stage); a first terminal electrode 21a (see FIG. 3) electrically connected to the second terminal electrode of the drive TFT 9d; and a second terminal electrode 21c (see FIG. 3) electrically connected to a first electrode 31a of the organic EL element 35 to be described later. Furthermore, as illustrated in FIG. 3, the light-emission control TFT 9f includes: a first semiconductor layer 12a provided on the base coat film 11; the first gate insulating film 13 provided on the first semiconductor layer 12a; the gate electrode 14a provided on the first gate insulating film 13; the first interlayer insulating film provided to cover the gate electrode 14a; and the first terminal electrode 21a and a second terminal electrode 21b (21c) provided on the second interlayer insulating film 20 and spaced apart from each other. Here, the first semiconductor layer 12a includes: a first conductor region and a second conductor region spaced apart from each other; and a first channel region defined between the first conductor region and the second conductor region. Moreover, as illustrated in FIG. 3, the first terminal electrode 21a and the second terminal electrode 21b are respectively and electrically connected to the first conductor region and the second conductor region of the first semiconductor layer 12a through two contact holes formed in a multilayer film including the first gate insulating film 13, the first interlayer insulating film 15, and the second interlayer insulating film 20. Moreover, as illustrated in FIG. 3, the second terminal electrode 21c is electrically connected to the second conductor region of the first semiconductor layer 12a through: a contact hole formed in a multilayer film including the first gate insulating film 13 and the first interlayer insulating film 15; a relay electrode 16a; and a contact hole formed in the second interlayer insulating film 20.

As illustrated in FIG. 4, in each subpixel P, the anode discharge TFT 9g has: a gate electrode 19a (see FIG. 3) electrically connected to the gate line 14g (n) in the corresponding stage (n-th stage); a third terminal electrode 21c (see FIG. 3) electrically connected to the first electrode 31a of the organic EL element 35; and a fourth terminal electrode 21d (see FIG. 3) electrically connected to the second initialization power supply line 19i. Note that the third terminal electrode 21c of the anode discharge TFT 9g is shared with the second terminal electrode 21c of the light-emission control TFT 9f. Furthermore, as illustrated in FIG. 3, the anode discharge TFT 9g includes: a second semiconductor layer 17a provided on the first interlayer insulating film 15; a second gate insulating film 18a provided on the second semiconductor layer 17a; the gate electrode 19a provided on the second gate insulating film 18a; the second interlayer insulating film 20 provided to cover the gate electrode 19a; and the third terminal electrode 21c and the fourth terminal electrode 21d provided on the second interlayer insulating film 20 and spaced apart from each other. Here, the second semiconductor layer 17a includes: a third conductor region and a fourth conductor region spaced apart from each other; and a second channel region defined between the third conductor region and the fourth conductor region. Moreover, as illustrated in FIG. 3, the third terminal electrode 21c is electrically connected to the third conductor region of the second semiconductor layer 17a through: the contact hole formed in the second interlayer insulating film 20; and the relay electrode 16a. In addition, as illustrated in FIG. 3, the fourth terminal electrode 21d is electrically connected to the fourth conductor region of the second semiconductor layer 17a through: a contact hole formed in the second interlayer insulating film 20; and a relay electrode 16b.

Note that this embodiment exemplifies a pixel circuit including: the write TFT 9c, the drive TFT 9d, the power supply TFT 9e, and the light-emission control TFT 9f as the first TFTs each having the first semiconductor layer formed of polysilicon; and the initialization TFT 9a, the compensation TFT 9b, and the anode discharge TFT 9g as the second TFTs each having the second semiconductor layer formed of oxide semiconductor. Alternatively, all of the TFTs in the pixel circuit; namely, the initialization TFT 9a, the compensation TFT 9b, the write TFT 9c, the drive TFT 9d, the power supply TFT 9e, the light-emission control TFT 9f, and the anode discharge TFT 9g, may have a semiconductor layer formed of oxide semiconductor.

As illustrated in FIG. 4, in each subpixel P, the capacitor 9h has: the lower conductive layer 16c (see FIG. 3) electrically connected to the gate electrode 14b (see FIG. 3) of the drive TFT 9d and to the third terminal electrode of each of the initialization TFT 9a and the compensation TFT 9b; and an upper conductive layer 19b (see FIG. 3) electrically connected to the third terminal electrode of the anode discharge TFT 9g through a relay layer 21f, to the second terminal electrode of the light-emission control TFT 9f, and to the first electrode 31a of the organic EL element 35. Furthermore, as illustrated in FIG. 3, the capacitor 9h includes: the lower conductive layer 16c formed of the same material as, and in the same layer as, the relay electrodes 16a and 16b; a second gate insulating film 18b provided on the lower conductive layer 16c; and the upper conductive layer 19b provided on the second gate insulating film 18b, and formed of the same material as, and in the same layer as, the gate electrode 19a.

The planarization film 22a is provided in common among the plurality of subpixels P. As illustrated in FIG. 3, the planarization film 22a has a flat portion L for each of the subpixels P. The flat portion L protrudes flatly toward the organic EL element layer 40a. The planarization film 22a is formed of, for example, an organic resin material such as polyimide resin or an acrylic resin, or an organic insulating film formed of such a material as a polysiloxane-based spin-on-glass (SOG) material.

The organic EL element layer 40a includes: a plurality of the first electrodes 31a; a common edge cover 32a; a plurality of the organic EL layers 33; and a common second electrode 34, all of which are sequentially stacked on top of another in association with the plurality of subpixels P. Here, for each of the subpixels P, the first electrode 31a, the organic EL layer 33, and the second electrode 34 constitute an organic EL element 35 (see FIG. 4).

The first electrode 31a is electrically connected to the second terminal electrode 21c of the light-emission control TFT 9f for each subpixel P through a contact hole formed in the planarization film 22a. Furthermore, as illustrated in FIG. 3, the first electrode 31a has a peripheral edge portion surrounding, in plan view, the first semiconductor layer or the second semiconductor layer of the initialization TFT 9a, the compensation TFT 9b, the write TFT 9c, the drive TFT 9d, the power supply TFT 9e, the light-emission control TFT 9f, and the anode discharge TFT 9g arranged in each subpixel P. The peripheral edge portion is provided along a side surface of the flat portion L of the planarization film 22a, so as to protrude approximately 1 μm toward the resin substrate layer 10. Moreover, as illustrated in FIG. 3, the first electrode 31a has an E-shaped cross-section (rotated by 90° to the right). In addition, the first electrode 31a has a function of injecting holes into the organic EL layer 33. Furthermore, the first electrode 31a is preferably formed of a material having a large work function to improve efficiency in injecting the holes into the organic EL layer 33. Here, examples of the material forming the first electrode 31a include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Moreover, the first electrode 31a may be made of, for example, an alloy of astatine (At)/astatine oxide ($AtO_2$). Furthermore, the first electrode 31a may be made of a conductive oxide such as, for example, tin oxide (SnO), zinc oxide (ZnO), indium tin oxide (ITO), or indium zinc oxide (IZO). In addition, the first electrode 31a may be formed of a plurality of layers made of the above materials and stacked on top of another. Note that examples of compound materials having a large work function include indium tin oxide (ITO) and indium zinc oxide (IZO). Moreover, the first electrode 31a has a film thickness of, for example, approximately 160 nm, and, preferably, 150 nm or more and 300 nm or less.

The edge cover 32a is provided in a grid in common among all the subpixels P, and formed of, for example, an organic resin material such as polyimide resin or acrylic resin, or a polysiloxane-based SOG material. Furthermore, the edge cover 32a illustrated in FIG. 3 is provided to cover the peripheral edge portion of each first electrode 31a.

The organic EL layer 33 is provided as a light-emitting functional layer. As illustrated in FIG. 5, the organic EL layer 33 includes: a hole injection layer 1; a hole transport layer 2; a light-emitting layer 3; an electron transport layer 4; and an electron injection layer 5, all of which are sequentially stacked on top of another on the first electrode 31a.

The hole injection layer 1 is also referred to as an anode buffer layer. The hole injection layer 1 has a function of approximating energy levels between the first electrode 31a and the organic EL layer 33 to improve efficiency in injecting the holes from the first electrode 31a into the organic EL layer 33. Here, examples of a material forming the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 has a function of improving efficiency in transporting the holes from the first electrode 31a to the organic EL layer 33. Here, examples of a material forming the hole transport layer 2 include a porphyrin derivative, an aromatic tertiary amine compound, a styrylamine derivative, polyvinyl carbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, zinc selenide, and zinc selenide.

The light-emitting layer 3 is a region where the holes and the electrons are respectively injected from the first electrode 31a and the second electrode 34, and recombine together, when a voltage is applied with the first electrode 31a and the second electrode 34. Here, the light-emitting layer 3 is formed of a material having a high light-emission efficiency. Examples of the material forming the light-emitting layer 3 include a metal oxinoid compound[8-hydroxyquinoline metal complex], a naphthalene derivative, an anthracene derivative, a diphenylethylene derivative, a vinylacetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrylbenzene derivative, perylene derivative, a perinone derivative, an aminopyrene derivative, a pyridine derivative, a rhodamine derivative, an aquizine derivative, phenoxazone, a quinacridone derivative, rubrene, poly-p-phenylenevinylene, and polysilane.

The electron transport layer 4 has a function of efficiently moving the electrons to the light-emitting layer 3. Here, examples of a material forming the electron transport layer 4 include, as organic compounds, an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 has a function of approximating energy levels between the second electrode 34 and the organic EL layer 33 to improve efficiency in injecting the electrons from the second electrode 34 into the organic EL layer 33. Such a function can decrease a drive voltage of the organic EL element 35. Note that the electron injection layer 5 is also referred to as a cathode buffer layer. Here, examples of a material forming the electron injection layer 5 include: inorganic alkali compounds such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

As illustrated in FIG. 3, the second electrode 34 is provided in common among all the subpixels P to cover each organic EL layer 33 and the edge cover 32a. Moreover, the second electrode 34 has a function of injecting the electrons into the organic EL layer 33. Furthermore, the second electrode 34 is preferably formed of a material having a small work function to improve efficiency in injecting the electrons into the organic EL layer 33. Here, examples of the material forming the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Moreover, the second electrode 34 may be formed of an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), or lithium fluoride (LiF)/calcium (Ca)/aluminum (Al). Furthermore, the second electrode 34 may be formed of a conductive oxide such as tin oxide (SnO), zinc oxide (ZnO), indium tin oxide (ITO), or indium zinc oxide (IZO). In addition, the second electrode 34 may be formed of a plurality of layers made of the above materials and stacked on top of another. Note that examples of the material having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 3, the sealing film 45 is provided to cover the second electrode 34, and includes: a first inorganic sealing film 41; an organic sealing film 42; and a second inorganic sealing film 43, all of which are sequentially stacked on top of another above the second electrode 34. The sealing film 40 has a function of protecting the organic EL layers 33 in the organic EL element layer 35 from moisture and oxygen. Here, each of the first inorganic sealing film 41 and the second inorganic sealing film 43 is formed of such an inorganic insulating film as, for example, a silicon nitride film, a silicon oxide film, or a silicon oxynitride film. Moreover, the organic sealing film 42 is formed of such an organic resin material as, for example, acrylic resin, epoxy resin, silicone resin, polyurea resin, parylene resin, polyimide resin, or polyamide resin.

Furthermore, as illustrated in FIG. 1, the organic EL display device 50a includes, in the picture-frame region F: a first outer dam wall Wa shaped into a picture frame and provided out of the trench G to surround the display region D; and a second outer dam wall Wb shaped into a picture frame and provided around the first outer dam wall Wa. Here, each of the first outer dam wall Wa and the second outer dam wall Wb includes, for example: a lower resin layer formed of the same material as, and in the same layer as, the planarization film 22a is; and an upper resin layer provided on the lower resin layer, and formed of the same material as, and in the same layer as, the edge cover 32a is. Note that the first outer dam wall Wa is provided to overlap with an outer peripheral end portion of the organic sealing film 42 included in the sealing film 45, so as to keep ink for forming the organic sealing film 42 from spreading out.

Moreover, as illustrated in FIG. 1, the organic EL display device 50a includes a first picture-frame wire 21j in the picture-frame region F. The first picture-frame wire 21j is shaped into a picture frame and provided behind the trench G. The first picture-frame wire 21j has opposing end portions provided to the opening of the trench G and extending toward the terminal unit T. Here, the first picture-frame wire 21j is connected to the power supply line 21i in the picture-frame region F toward the display region D, and receives the high power supply voltage (ELVDD) in the terminal unit T.

Furthermore, as illustrated in FIG. 1, the organic EL display device 50a includes a second picture-frame wire 21k in the picture-frame region F. The second picture-frame wire 21k is shaped into a substantial C-shape and provided out of the trench G. The second picture-frame wire 21k has opposing end portions extending toward the terminal unit T. Here, the second picture-frame wire 21k is electrically connected to the second electrode 34 in the picture-frame region F toward the display region D, and receives the low power supply voltage (ELVSS) in the terminal unit T.

As to the organic EL display device 50a having the above configuration, in each subpixel P, when the light-emission control line 14e is first selected to be in an inactive state, the organic EL element 35 is in a non light-emission state. In the non light-emission state, the gate line 14g (n−1) in the preceding stage is selected. Through the gate line 14g (n−1), a gate signal is input into the initialization TFT 9a such that the initialization TFT 9a turns ON. Hence, the high power supply voltage ELVDD of the power supply line 21i is applied to the capacitor 9h, and the drive TFT 9d turns ON. Thus, charges of the capacitor 9h are discharged, and a voltage to be applied to the gate electrode of the drive TFT 9d is initialized. Next, when the gate line 14g (n) of the corresponding stage is selected to be in the active state, the compensation TFT 9b and the write TFT 9c turn ON, and a predetermined voltage corresponding to a source signal to be transmitted through the corresponding source line 21h is written into the capacitor 9h through the drive TFT 9d connected to a diode. Simultaneously, the anode discharge TFT 9g turns ON, and an initialization signal is applied through the second initialization power supply line 19i to the first electrode 31a of the organic EL element 35. Hence, the charges stored in the first electrode 31a are reset. After that, the light-emission control line 14e is selected, and the power supply TFT 9e and the light-emission control TFT 9f turn ON. Hence, a drive current corresponding to the voltage applied to the gate electrode of the drive TFT 9d is supplied from the power supply line 21i to the organic EL element 35. Thus, in each subpixel P, the organic EL element 35 emits light the luminance of which corresponds to the drive current. This is how the organic EL display device 50a displays an image. Furthermore, as to the organic EL display device 50a, in each pixel P of the display region D, the peripheral edge portion of the first electrode 31a is provided to surround each of the TFTs 9a to 9g in plan view, and to protrude toward the resin substrate layer 10. Thanks to such a structure, the peripheral edge portion of the first electrode 31a blocks stray light including light emitted from the organic EL element 35 and light from outside. That is why the stray light is less likely to enter the TFTs 9a to 9g.

Described next will be a method for producing the organic EL display device 50a of this embodiment. Here, the method for producing the organic EL display device 50a of this embodiment includes: a TFT-layer forming step; an organic-EL-element-layer forming step; and a sealing-film forming step.

TFT-Layer Forming Step

First, for example, a silicon oxide film (approximately 250 nm in thickness) and a silicon nitride film (approximately 100 nm in thickness) are sequentially deposed by, for example, plasma chemical vapor deposition (CVD) on the resin substrate layer 10 formed on a glass substrate. Hence, the base coat film 11 is formed.

Then, on a substrate surface of the base coat film 11, for example, an amorphous silicon film (approximately 50 nm in thickness) is deposited by the plasma CVD. The amorphous silicon film is crystallized by such a technique as laser annealing to form a polysilicon film. The polysilicon film is patterned to form such a layer as the first semiconductor layer 12a.

Furthermore, on a substrate surface of the first semiconductor layer 12a, for example, a silicon oxide film (approximately 100 nm in thickness) is deposited by the plasma CVD to form the first gate insulating film 13. After that, a metal film such as a molybdenum film (approximately 100 nm in thickness) is deposited by sputtering. The metal film is patterned to form such a constituent feature as the gate electrode 14a.

After that, on a substrate surface of the gate electrode 14a, for example, a silicon oxide film (approximately 100 nm in thickness) is deposited by the plasma CVD to form the first interlayer insulating film 15. After that, a metal film such as a molybdenum film (approximately 100 nm in thickness) is deposited by sputtering. The metal film is patterned to form such a constituent feature as the relay electrode 16a.

Subsequently, on a substrate surface of the relay electrode 16a, for example, a semiconductor film (approximately 30 nm in thickness) formed of such a substance as InGaZnO$_4$ is deposited by sputtering and annealed. The semiconductor film is patterned to form the second semiconductor layer 17a.

Furthermore, on a substrate surface of the second semiconductor layer 17a, for example, a silicon oxide film (approximately 300 nm in thickness) is deposited by the plasma CVD. After that, a metal film such as a molybdenum film (approximately 100 nm in thickness) is deposited by sputtering. A multilayer film including these films is patterned to form such constituent features as the second gate insulating film 18a and the gate electrode 19a.

After that, on substrate surfaces of the second gate insulating film 18a and the gate electrode 19a, for example, a silicon oxide film (approximately 150 nm in thickness) is deposited by the plasma CVD to form the second interlayer insulating film 20.

Subsequently, contact holes are appropriately formed in the first gate insulating film 13, the first interlayer insulating film 15, and the second interlayer insulating film 20. After that, for example, such films as a titanium film (approximately 50 nm in thickness), an aluminum film (approximately 400 nm in thickness), and a titanium film (approximately 50 nm in thickness) are sequentially deposited by sputtering to form a multilayer metal film. The multilayer metal film is patterned to form such constituent features as the first terminal electrode 21a and the second terminal electrode 21b.

Furthermore, substrate surfaces of the first terminal electrode 21a and the second terminal electrode 21b are coated with, for example, a polyimide-based photosensitive resin film (approximately 2 μn in thickness) by slit coating. The coating film is pre-baked, exposed to light, and post-baked to form the planarization film 22a having the flat portion L. Note that, when formed, the flat portion L is exposed to light the amount of which is reduced in half using, for example, a half-tone mask or a grayscale mask.

As described above, the TFT layer 30a is successfully formed.

Organic-EL-Element Layer Forming Step

On the second planarization film 22a of the TFT layer 30a formed at the TFT-layer forming step, the first electrode 31a, the edge cover 32a, the organic EL layer 33 (including the hole injection layer 1, the hole transport layer 2, the light-emitting layer 3, the electron transport layer 4, and the electron injection layer 5), and the second electrode 34 are formed, using a known technique. Hence, the organic EL element layer 40a is formed.

Sealing-Film Forming Step

On the organic-EL-element layer 40a formed at the organic-EL-element layer forming step, the sealing film 45 (including the first inorganic sealing film 41, the organic sealing film 42, and the second inorganic sealing film 43) is formed, using a known technique. After that, a protective sheet (not shown) is attached to a substrate surface of the sealing film 45. Then, a laser beam is emitted from toward the glass substrate of the resin substrate layer 10, and the glass substrate is removed from a lower surface of the resin substrate layer 10. Furthermore, to the lower surface of the resin substrate layer 10 from which the glass substrate is removed, a protective sheet (not shown) is attached.

As described above, the organic EL display device 50a of this embodiment is successfully produced.

As described above, the organic EL display device 50a of this embodiment has following features. In each of the subpixels P in the display region D, the peripheral edge portion of the first electrode 31a is provided to: surround, in plan view, the first semiconductor layers 12a and 12b or the second semiconductor layer 17a of the initialization TFT 9a, the compensation TFT 9b, the write TFT 9c, the drive TFT 9d, the power supply TFT 9e, the light-emission control TFT 9f, and the anode discharge TFT 9g; and protrude toward the resin substrate layer 10. The peripheral edge portion of the first electrode 31a can block stray light including light emitted from the organic EL element 35 and outside light. Such features can reduce light incident on the initialization TFT 9a, the compensation TFT 9b, the write TFT 9c, the drive TFT 9d, the power supply TFT 9e, the light-emission control TFT 9f, and the anode discharge TFT 9g arranged in each subpixel P, thereby making it possible to reduce deterioration of TFT characteristics caused by the incident light. Note that the initialization TFT 9a, the compensation TFT 9b, the write TFT 9c, the drive TFT 9d, the power supply TFT 9e, the light-emission control TFT 9f, and the anode discharge TFT 9g arranged in each of the subpixels P in the display region D include: the first TFTs (the write TFT 9c, the drive TFT 9d, the power supply TFT 9e, and the light-emission control TFT 9f) formed of polysilicon; and the second TFTs (the initialization TFT 9a, the compensation TFT 9b, and the anode discharge TFT 9g) formed of semiconductor oxide and susceptible to light. Such features can reduce, in particular, deterioration of TFT characteristics caused by the incident light.

Moreover, as to the organic EL display device 50a of this embodiment, the peripheral edge portion of the first electrode 31a is formed thicker than any other portion of the first electrode 31a. The thick peripheral edge portion can reduce the risk that the first electrode 31a would be side-etched when the first electrode 31a is patterned by wet-etching. Such a feature can reduce an area in which the peripheral end portion of the first electrode 31a and the edge cover 32a overlap with each other, thereby making it possible to block light to, and provide a high aperture ratio for, each of the subpixels P, and to display an image with high definition. Besides, the feature can keep light, including light emitted from the organic EL element 35 itself and light from outside, from entering the TFTs 9a to 9g below the organic EL element 35, thereby making it possible to improve reliability and characteristics of the device against the outside light and image burn-in by the light.

Moreover, as to the organic EL display device 50a of this embodiment, the peripheral edge portion of the first electrode 31a is provided along a side surface of each flat portion L of the planarization film 22a. Such a feature can form the peripheral edge portion of the first electrode 31a to protrude toward the resin substrate layer 10 by simply forming the planarization film 22a into a predetermined shape without an additional production step.

Second Embodiment

Figure 6:
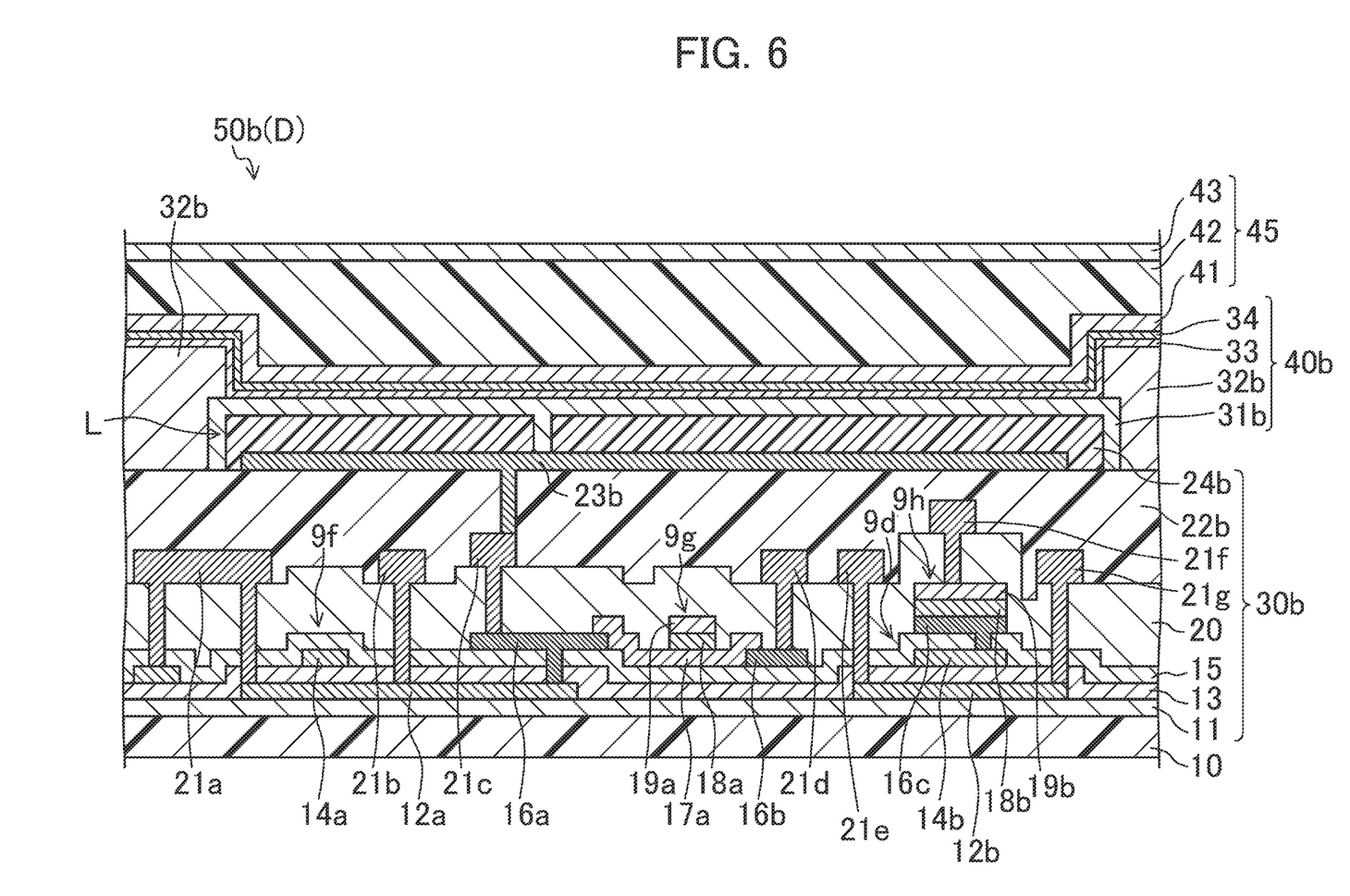
FIG. 6 is a cross-sectional view of a display region of an organic EL display device according to a second embodiment of the disclosure.

FIG. 6 illustrates a second embodiment of the display device according to the disclosure. Here, FIG. 6 is a cross-sectional view of the display region D of an organic EL display device 50b according to this embodiment. FIG. 6 corresponds to FIG. 3 shown in the first embodiment. Note that, in the embodiments below, like reference signs designate identical constituent features throughout FIGS. 1 to 6. These constituent features will not be elaborated upon here.

The first embodiment exemplifies the organic EL display device 50a including the TFT layer 30a provided with the planarization film 22a. This embodiment exemplifies the organic EL display device 50b including a TFT layer 30b provided with: a first planarization film 22b toward the resin substrate layer 10; and a second planarization film 24b toward an organic EL element layer 40b.

Similar to the organic EL display device 50a of the first embodiment, the organic EL display device 50b includes: the display region D; and the picture-frame region F provided around the display region D.

Furthermore, as illustrated in FIG. 6, the organic EL display device 50b includes: the resin substrate layer 10; the TFT layer 30b provided on the resin substrate layer 10; the organic EL element layer 40b provided on the TFT layer 30b; and the sealing film 45 provided to cover the organic EL element layer 40b.

The TFT layer 30b, as illustrated in FIG. 6, includes: the base coat film 11 provided on the resin substrate layer 10; the initialization TFT 9a (see FIG. 4), the compensation TFT 9b (see FIG. 4), the write TFT 9c (see FIG. 4), the drive TFT 9d, the power supply TFT 9e (see FIG. 4), the light-emission control TFT 9f, the anode discharge TFT 9g, and the capacitor 9h, all of which are arranged on the base coat film 11 for each subpixel P; the first planarization film 22b stacked on the TFTs 9a to 9g and the capacitor 9h; a relay electrode 23b provided on the first planarization film 22b and serving as a wiring layer of each subpixel P; and the second planarization film 24b provided on the relay electrode 23b. Here, similar to the TFT layer 30a of the first embodiment, the TFT layer 30b includes the plurality of gate lines 14g, the plurality of light-emission control lines 14e, the plurality of second initialization power supply lines 19i, the plurality of source lines 21h, and the plurality of power supply lines 21i. Furthermore, as illustrated in FIG. 6, the relay electrode 23b is provided to overlap with the initialization TFT 9a, the compensation TFT 9b, the write TFT 9c, the drive TFT 9d, the power supply TFT 9e, the light-emission control TFT 9f, and the anode discharge TFT 9g arranged in each subpixel P Each of the first planarization film 22b and the second planarization film 24b is formed of, for example, an organic resin material such as polyimide resin or acrylic resin, or an organic insulating film formed of such a material as a polysiloxane-based SOG material. Here, the first planarization film 22b is provided in common among the plurality of subpixels P, and has a flat surface in the display region D. Furthermore, the second planarization film 24b is provided for each of the subpixels P. As illustrated in FIG. 6, the second planarization film 24b includes the flat portion L protruding flatly toward the organic EL element layer 40b.

The organic EL element layer 40b includes: a plurality of first electrodes 31b; a common edge cover 32b; the plurality of organic EL layers 33; and the common second electrode 34, all of which are sequentially stacked on top of another in association with the plurality of subpixels P. Here, for each of the subpixels P, a first electrode 31b, an organic EL layer 33, and the second electrode 34 constitute the organic EL element 35 (see FIG. 4).

The first electrode 31b is electrically connected to the second terminal electrode 21c of the light-emission control TFT 9f in each subpixel P, through a contact hole formed in the first planarization film 22b, the relay electrode 23b, and a contact hole formed in the second planarization film 24b. Furthermore, as illustrated in FIG. 6, the first electrode 31b has a peripheral edge portion surrounding, in plan view, the first semiconductor layer or the second semiconductor layer of the initialization TFT 9a, the compensation TFT 9b, the write TFT 9c, the drive TFT 9d, the power supply TFT 9e, the light-emission control TFT 9f, and the anode discharge TFT 9g arranged in each subpixel P. The peripheral edge portion is provided along a side surface of the flat portion L of the second planarization film 24b, so as to protrude approximately 1 µm toward the resin substrate layer 10. Moreover, as illustrated in FIG. 6, the first electrode 31b has an E-shaped cross-section (rotated by 90° to the right). In addition, the first electrode 31b has a function of injecting holes into the organic EL layer 33. Furthermore, the first electrode 31b is preferably formed of a material having a large work function to improve efficiency in injecting the holes into the organic EL layer 33. Here, examples of the material forming the first electrode 31b include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Moreover, the first electrode 31b may be made of, for example, an alloy of astatine (At)/astatine oxide ($AtO_2$). Furthermore, the first electrode 31b may be made of a conductive oxide such as, for example, tin oxide (SnO), zinc oxide (ZnO), indium tin oxide (ITO), or indium zinc oxide (IZO). In addition, the first electrode 31b may be formed of a plurality of layers made of the above materials and stacked on top of another.

Note that examples of compound materials having a large work function include indium tin oxide (ITO) and indium zinc oxide (IZO).

The edge cover 32b is provided in a grid in common among all the subpixels P, and formed of, for example, an organic resin material such as polyimide resin or acrylic resin, or a polysiloxane-based SOG material. Furthermore, the edge cover 32b illustrated in FIG. 6 is provided to cover the peripheral edge portion of each first electrode 31b.

The organic EL display device 50b of the above configuration is similar to the organic EL display device 50a according to the first embodiment. In each subpixel P, the organic EL element 35 emits light the luminance of which corresponds to the drive current. This is how the organic EL display device 50b displays an image. Furthermore, as to the organic EL display device 50b, in each pixel P of the display region D, the peripheral edge portion of the first electrode 31b is provided to surround each of the TFTs 9a to 9g in plan view, and to protrude toward the resin substrate layer 10. Thanks to such a structure, the peripheral edge portion of the first electrode 31b blocks stray light including light emitted from the organic EL element 35 and light from outside. That is why the stray light is less likely to enter the TFTs 9a to 9g. The organic EL display device 50b of this embodiment can be produced by the method for producing the organic EL display device 50a of the first embodiment. At the TFT layer forming step, the first planarization film 22b is formed instead of the planarization film 22a. After that, on a substrate surface of the first planarization film 22b, for example, such films as a titanium film, an aluminum film, and a titanium film are sequentially deposited by sputtering to form a multilayer metal film. The multilayer metal film is patterned to form the relay electrode 23b. Furthermore, a substrate surface of the relay electrode 23b is coated with, for example, a polyimide-based photosensitive resin film by slit coating. The coating film is pre-baked, exposed to light, developed, and post-baked to form the second planarization film 24b.

As described above, the organic EL display device 50b of this embodiment has following features. In each of the subpixels P of the display region D, the peripheral edge portion of the first electrode 31b is provided to: surround, in plan view, the first semiconductor layers 12a and 12b or the second semiconductor layer 17a of the initialization TFT 9a, the compensation TFT 9b, the write TFT 9c, the drive TFT 9d, the power supply TFT 9e, the light-emission control TFT 9f, and the anode discharge TFT 9g; and protrude toward the resin substrate layer 10. The peripheral edge portion of the first electrode 31b can block stray light including light emitted from the organic EL element 35 and outside light. Such features can reduce light incident on the initialization TFT 9a, the compensation TFT 9b, the write TFT 9c, the drive TFT 9d, the power supply TFT 9e, the light-emission control TFT 9f, and the anode discharge TFT 9g arranged in each subpixel P, thereby making it possible to reduce deterioration of TFT characteristics caused by the incident light. Note that the initialization TFT 9a, the compensation TFT 9b, the write TFT 9c, the drive TFT 9d, the power supply TFT 9e, the light-emission control TFT 9f, and the anode discharge TFT 9g arranged in each of the subpixels P in the display region D include: the first TFTs (the write TFT 9c, the drive TFT 9d, the power supply TFT 9e, and the light-emission control TFT 9f) formed of polysilicon; and the second TFTs (the initialization TFT 9a, the compensation TFT 9b, and the anode discharge TFT 9g) formed of semiconductor oxide and susceptible to light. Such features can reduce, in particular, deterioration of TFT characteristics caused by the incident light.

Moreover, as to the organic EL display device 50b of this embodiment, the peripheral edge portion of the first electrode 31b is formed thicker than any other portion of the first electrode 31b. The thick peripheral edge portion can reduce the risk that the first electrode 31b would be side-etched when the first electrode 31b is patterned by wet-etching. Such a feature can reduce an area in which the peripheral end portion of the first electrode 31b and the edge cover 32b overlap with each other, thereby making it possible to block light to, and provide a high aperture ratio for, each of the subpixels P, and to display an image with high definition. Besides, the feature can keep light, including light emitted from the organic EL element 35 itself and light from outside, from entering the TFTs 9a to 9g below the organic EL element 35, thereby making it possible to improve reliability and characteristics of the device against the outside light and image burn-in by the light.

Moreover, as to the organic EL display device 50b of this embodiment, the peripheral edge portion of the first electrode 31b is provided along a side surface of the flat portion L of the second planarization film 24b. Such a feature can form the peripheral edge portion of the first electrode 31b to protrude toward the resin substrate layer 10 by simply forming the second planarization film 24b into a predetermined shape without an additional production step.

In addition, as to the organic EL display device 50b of this embodiment, the relay electrode 23b is provided between the first planarization film 22b and the second planarization film 24b for each of the subpixels P. The relay electrode 23b blocks light to the first semiconductor layers 12a and 12b, or the second semiconductor layer 17a, of the initialization TFT 9a, the compensation TFT 9b, the write TFT 9c, the drive TFT 9d, the power supply TFT 9e, the light-emission control TFT 9f, and the anode discharge TFT 9g arranged in each subpixel P. Such a feature can reduce, in particular, deterioration of TFT characteristics caused by incoming light.

Third Embodiment

Figure 7:
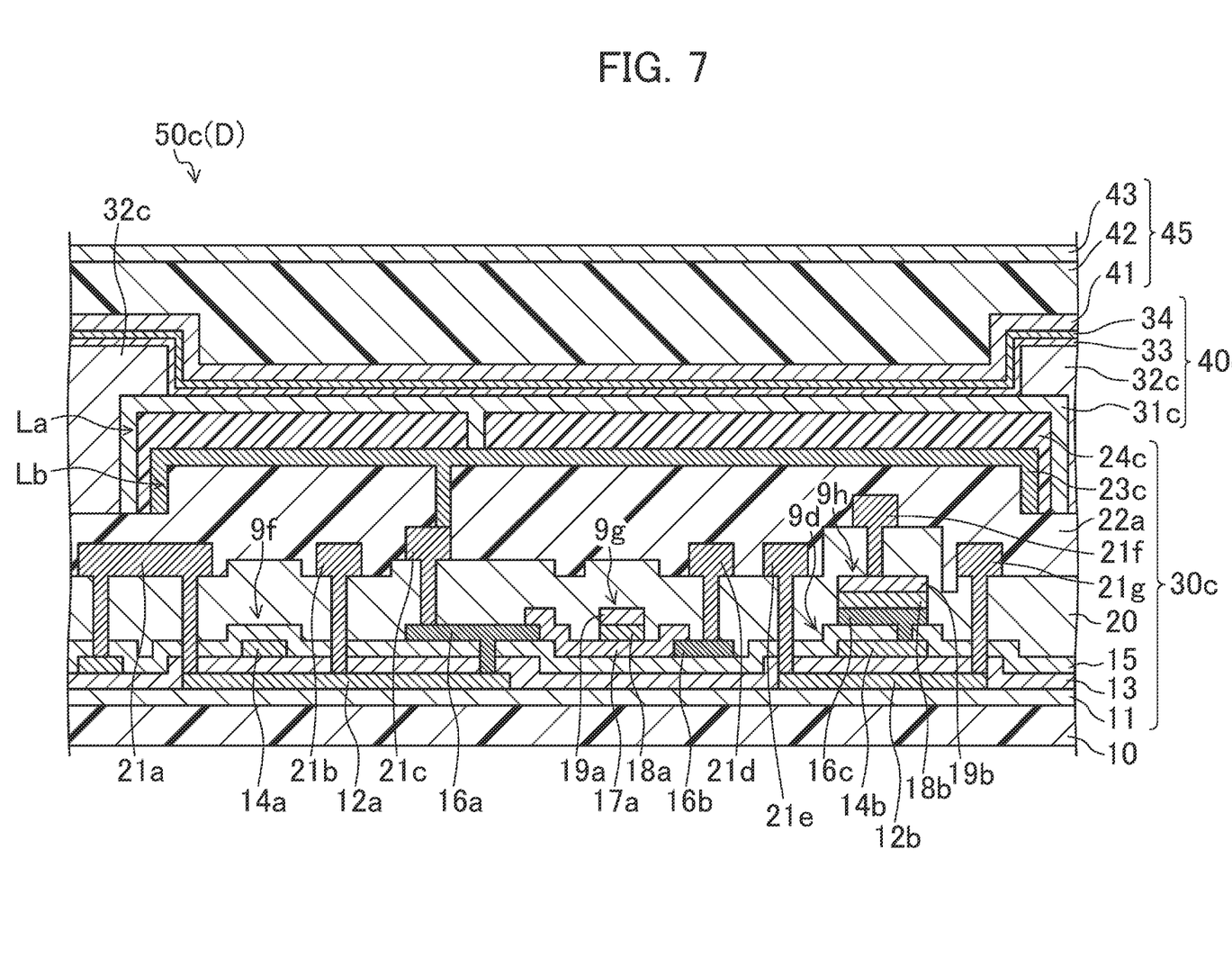
FIG. 7 is a cross-sectional view of a display region of an organic EL display device according to a third embodiment of the disclosure.

FIG. 7 illustrates a third embodiment of the display device according to the disclosure. Here, FIG. 7 is a cross-sectional view of the display region D of an organic EL display device 50b according to this embodiment. FIG. 7 corresponds to FIG. 3 shown in the first embodiment.

The second embodiment exemplifies the organic EL display device 50b including the TFT layer 30b provided with the relay electrode 23b having a flat shape. This embodiment exemplifies an organic EL display device 50c including a TFT layer 30c provided with a relay electrode 23c having a non-flat shape.

Similar to the organic EL display device 50a of the first embodiment, the organic EL display device 50c includes: the display region D; and the picture-frame region F provided around the display region D.

Furthermore, as illustrated in FIG. 7, the organic EL display device 50c includes: the resin substrate layer 10; the TFT layer 30c provided on the resin substrate layer 10; an organic EL element layer 40c provided on the TFT layer 30c; and the sealing film 45 provided to cover the organic EL element layer 40c.

The TFT layer 30c, as illustrated in FIG. 7, includes: the base coat film 11 provided on the resin substrate layer 10; the initialization TFT 9a (see FIG. 4), the compensation TFT 9b (see FIG. 4), the write TFT 9c (see FIG. 4), the drive TFT 9d, the power supply TFT 9e (see FIG. 4), the light-emission control TFT 9f, the anode discharge TFT 9g, and the capacitor 9h, all of which are arranged on the base coat film 11 for each subpixel P; a first planarization film 22a stacked on the TFTs 9a to 9g and the capacitor 9h; the relay electrode 23c provided on the first planarization film 22a and serving as a wiring layer of each subpixel P; and a second planarization film 24c provided on the relay electrode 23c. Here, similar to the TFT layer 30a of the first embodiment, the TFT layer 30c includes the plurality of gate lines 14g, the plurality of light-emission control lines 14e, the plurality of second initialization power supply lines 19i, the plurality of source lines 21h, and the plurality of power supply lines 21i.

The second planarization film 24c is provided for each of the subpixels P. As illustrated in FIG. 7, the second planarization film 24c includes an upper flat portion La protruding flatly toward the organic EL element layer 40c. The second planarization film 24c is formed of, for example, an organic resin material such as polyimide resin or an acrylic resin, or an organic insulating film formed of such a material as a polysiloxane-based SOG material. Note that, as described above, the first planarization film 22a is provided in common among the plurality of subpixels P. As illustrated in FIG. 7, the first planarization film 22a has a lower flat portion Lb for each of the subpixels P. The lower flat portion Lb protrudes flatly toward the organic EL element layer 40c.

As illustrated in FIG. 7, the relay electrode 23c is provided to overlap with the initialization TFT 9a, the compensation TFT 9b, the write TFT 9c, the drive TFT 9d, the power supply TFT 9e, the light-emission control TFT 9f, and the anode discharge TFT 9g arranged in each subpixel P. Furthermore, as illustrated in FIG. 7, the relay electrode 23c has a peripheral edge portion surrounding, in plan view, the first semiconductor layer or the second semiconductor layer of the initialization TFT 9a, the compensation TFT 9b, the write TFT 9c, the drive TFT 9d, the power supply TFT 9e, the light-emission control TFT 9f, and the anode discharge TFT 9g arranged in each subpixel P. The peripheral edge portion is provided along a side surface of the lower flat portion Lb of the first planarization film 22a, so as to protrude approximately 1 toward the resin substrate layer 10. Moreover, as illustrated in FIG. 7, the relay electrode 23c has an E-shaped cross-section (rotated by 90° to the right).

The organic EL element layer 40c includes: a plurality of first electrodes 31c; a common edge cover 32c; the plurality of organic EL layers 33; and the common second electrode 34, all of which are sequentially stacked on top of another in association with the plurality of subpixels P. Here, for each of the subpixels P, a first electrode 31c, an organic EL layer 33, and the second electrode 34 constitute the organic EL element 35 (see FIG. 4).

The first electrode 31c is electrically connected to the second terminal electrode 21c of the light-emission control TFT 9f in each subpixel P, through a contact hole formed in the first planarization film 22a, the relay electrode 23c, and a contact hole formed in the second planarization film 24c. Furthermore, as illustrated in FIG. 7, the first electrode 31c has a peripheral edge portion surrounding, in plan view, the first semiconductor layer or the second semiconductor layer of the initialization TFT 9a, the compensation TFT 9b, the write TFT 9c, the drive TFT 9d, the power supply TFT 9e, the light-emission control TFT 9f, and the anode discharge TFT 9g arranged in each subpixel P. The peripheral edge portion is provided along a side surface of the upper flat portion La of the second planarization film 24c, so as to protrude approximately 1 μm toward the resin substrate layer 10. Moreover, as illustrated in FIG. 7, the first electrode 31c has an E-shaped cross-section (rotated by 90° to the right). In addition, the first electrode 31c has a function of injecting holes into the organic EL layer 33. Furthermore, the first electrode 31c is preferably formed of a material having a large work function to improve efficiency in injecting the holes into the organic EL layer 33. Here, examples of the material forming the first electrode 31c include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Moreover, the first electrode 31c may be made of, for example, an alloy of astatine (At)/astatine oxide (AtO$_2$). Furthermore, the first electrode 31c may be made of a conductive oxide such as, for example, tin oxide (SnO), zinc oxide (ZnO), indium tin oxide (ITO), or indium zinc oxide (IZO). In addition, the first electrode 31c may be formed of a plurality of layers made of the above materials and stacked on top of another. Note that examples of compound materials having a large work function include indium tin oxide (ITO) and indium zinc oxide (IZO).

The edge cover 32c is provided in a grid in common among all the subpixels P, and formed of, for example, an organic resin material such as polyimide resin or acrylic resin, or a polysiloxane-based SOG material. Furthermore, the edge cover 32c illustrated in FIG. 7 is provided to cover the peripheral end portion of each first electrode 31b.

The organic EL display device 50c of the above configuration is similar to the organic EL display device 50a according to the first embodiment. In each subpixel P, the organic EL element 35 emits light the luminance of which corresponds to the drive current. This is how the organic EL display device 50c displays an image. Furthermore, as to the organic EL display device 50c, in each pixel P of the display region D, the peripheral edge portion of the first electrode 31c is provided to surround each of the TFTs 9a to 9g in plan view, and to protrude toward the resin substrate layer 10. Thanks to such a structure, the peripheral edge portion of the first electrode 31c blocks stray light including light emitted from the organic EL element 35 and light from outside. That is why the stray light is less likely to enter the TFTs 9a to 9g.

The organic EL display device 50c of this embodiment can be produced by the method for producing the organic EL display device 50b of the second embodiment. At the TFT layer forming step, the first planarization film 22b, the relay electrode 23b, and the second planarization film 24b are changed in shape when patterned.

As described above, the organic EL display device 50c of this embodiment has following features. In each of the subpixels P of the display region D, the peripheral edge portion of the first electrode 31c is provided to: surround, in plan view, the first semiconductor layers 12a and 12b or the second semiconductor layer 17a of the initialization TFT 9a, the compensation TFT 9b, the write TFT 9c, the drive TFT 9d, the power supply TFT 9e, the light-emission control TFT 9f, and the anode discharge TFT 9g; and protrude toward the resin substrate layer 10. The peripheral edge portion of the first electrode 31c can block stray light including light emitted from the organic EL element 35 and outside light. Such features can reduce light incident on the initialization TFT 9a, the compensation TFT 9b, the write TFT 9c, the drive TFT 9d, the power supply TFT 9e, the light-emission control TFT 9f, and the anode discharge TFT 9g arranged in each subpixel P, thereby making it possible to reduce deterioration of TFT characteristics caused by the incident light. Note that the initialization TFT 9a, the compensation TFT 9b, the write TFT 9c, the drive TFT 9d, the power supply TFT 9e, the light-emission control TFT 9f, and the anode discharge TFT 9g arranged in each of the subpixels P in the display region D include: the first TFTs (the write TFT 9c, the drive TFT 9d, the power supply TFT 9e, and the light-emission control TFT 9f) formed of polysilicon; and the second TFTs (the initialization TFT 9a, the compensation TFT 9b, and the anode discharge TFT 9g) formed of semiconductor oxide and susceptible to light. Such features can reduce, in particular, deterioration of TFT characteristics caused by the incident light.

Moreover, as to the organic EL display device 50c of this embodiment, the peripheral edge portion of the first electrode 31c is formed thicker than any other portion of the first electrode 31c. The thick peripheral edge portion can reduce the risk that the first electrode 31c would be side-etched when the first electrode 31c is patterned by wet-etching. Such a feature can reduce an area in which the peripheral end portion of the first electrode 31c and the edge cover 32c overlap with each other, thereby making it possible to block light to, and provide a high aperture ratio for, each of the subpixels P, and to display an image with high definition. Besides, the feature can keep light, including light emitted from the organic EL element 35 itself and light from outside, from entering the TFTs 9a to 9g below the organic EL element 35, thereby making it possible to improve reliability and characteristics of the device against the outside light and image burn-in by the light.

Moreover, as to the organic EL display device 50c of this embodiment, the peripheral edge portion of the first electrode 31c is provided along a side surface of the upper flat portion La of the second planarization film 24c. Such a feature can form the peripheral edge portion of the first electrode 31c to protrude toward the resin substrate layer 10 by simply forming the second planarization film 24c into a predetermined shape without an additional production step.

In addition, as to the organic EL display device 50c of this embodiment, the relay electrode 23c is provided between the first planarization film 22a and the second planarization film 24c for each of the subpixels P. The relay electrode 23c blocks light to the first semiconductor layers 12a and 12b, or the second semiconductor layer 17a, of the initialization TFT 9a, the compensation TFT 9b, the write TFT 9c, the drive TFT 9d, the power supply TFT 9e, the light-emission control TFT 9f, and the anode discharge TFT 9g arranged in each subpixel P. Such a feature can reduce, in particular, deterioration of TFT characteristics caused by incoming light.

Furthermore, as to the organic EL display device 50c of this embodiment, the peripheral edge portion of the relay electrode 23c is provided to: surround, in plan view, the first semiconductor layers 12a and 12b, or the second semiconductor layer 17a, of the initialization TFT 9a, the compensation TFT 9b, the write TFT 9c, the drive TFT 9d, the power supply TFT 9e, the light-emission control TFT 9f, and the anode discharge TFT 9g; and protrude toward the resin substrate layer 10. The peripheral edge portion of the relay electrode 23c can block stray light including light emitted from the organic EL element 35 and outside light. Such features can reduce light incident on the initialization TFT 9a, the compensation TFT 9b, the write TFT 9c, the drive TFT 9d, the power supply TFT 9e, the light-emission control TFT 9f, and the anode discharge TFT 9g arranged in each subpixel P, thereby making it possible to further reduce deterioration of TFT characteristics caused by the incident light.

Moreover, as to the organic EL display device 50c of this embodiment, the peripheral edge portion of the relay electrode 23c is provided along a side surface of the lower flat portion Lb of the first planarization film 22a. Such a feature can form the peripheral edge portion of the relay electrode 23c to protrude toward the resin substrate layer 10 by simply forming the first planarization film 22a into a predetermined shape without an additional production step.

OTHER EMBODIMENTS

In each of the above embodiments, the exemplified organic EL layer includes an organic EL layer of a multilayer structure including five layers such as a hole injection layer, a hole transport layer, a light-emitting layer, an electron transport layer, and an electron injection layer. Alternatively, the organic EL layer may be of a multilayer structure including three layers such as, for example, a hole-injection-and-hole-transport layer, a light-emitting layer, and an electron-transport-and-electron-injection layer.

Moreover, in each of the above embodiments, the exemplified organic EL display device includes a first electrode as an anode and a second electrode as a cathode. The disclosure can also be applied to an organic EL display device whose multilayer structure of the organic EL layer is inverted, and the first electrode is a cathode and the second electrode is an anode.

In addition, in each of the embodiments, the organic EL display device is exemplified as a display device. The disclosure can be applied to a display device including a plurality of light-emitting elements driven by currents. For example, the disclosure can be applied to a display device including quantum-dot light-emitting diodes (QLEDs); that is, light-emitting elements including layers containing quantum dots.

INDUSTRIAL APPLICABILITY

As described above, the disclosure is useful for a flexible display device.

The invention claimed is:
1. A display device, comprising:
a base substrate layer;
a thin-film transistor layer provided on the base substrate layer, and including a plurality of subpixels forming a display region, each of the subpixels of the plurality of subpixels being provided with a thin-film transistor on which a planarization film is stacked; and
a light-emitting element layer provided on the thin-film transistor layer, and including a plurality of first electrodes having an E-shaped cross-section, a common edge cover, a plurality of light-emitting functional layers, and a common second electrode, all of which are sequentially stacked on top of another in association with the plurality of subpixels,
a first inorganic sealing film provided to cover the light-emitting layer;
wherein each of the first electrodes of the plurality of first electrodes has a peripheral edge portion provided to: surround, in plan view, the thin-film transistor corresponding to the first electrode and protrude toward the base substrate layer;
wherein each of the plurality of light-emitting functional layers, the common second electrode and the first inorganic sealing film has another peripheral edge portions protrude opposite to the base substrate layer and the common edge cover is interposed between the peripheral edge portion and the another peripheral edge portions;

wherein the peripheral edge portion of each of the first electrodes of the plurality of first electrodes is provided along a side surface of an upper flat portion of the planarization film, the upper flat portion protruding flatly toward the light-emitting element layer.

2. The display device according to claim 1, wherein the planarization film is provided in common among the plurality of subpixels, and has the upper flat portion for each of the subpixels.

3. The display device according to claim 1, wherein the planarization film includes: a first planarization film provided toward the base substrate layer; and a second planarization film provided toward the light-emitting element layer, the thin-film transistor layer includes a wiring layer between the first planarization film and the second planarization film, the wiring layer being provided for each of the subpixels, the second planarization film includes the upper flat portion for each of the subpixels.

4. The display device according to claim 3, wherein the wiring layer is provided to overlap with the thin-film transistor corresponding to the wiring layer.

5. The display device according to claim 4, wherein the wiring layer has a peripheral edge portion provided to: surround, in plan view, the thin-film transistor corresponding to the wiring layer; and protrude toward the base substrate layer.

6. The display device according to claim 5, wherein the first planarization film is provided in common among the plurality of subpixels, and has a lower flat portion for each of the subpixels, the lower flat portion protruding flatly toward the light-emitting element layer, and the peripheral edge portion of the wiring layer is provided along a side surface of the lower flat portion.

7. The display device according to claim 6, wherein the wiring layer has an E-shaped cross-section.

8. The display device according to claim 1, further comprising a sealing film provided to cover the light-emitting element layer, and including the first inorganic sealing film, an organic sealing film, and a second inorganic sealing film sequentially stacked on top of another.

9. The display device according to claim 1, wherein the thin-film transistor includes: a first thin-film transistor having a first semiconductor layer formed of polysilicon; and a second thin-film transistor having a second semiconductor layer formed of oxide semiconductor.

10. The display device according to claim 1, wherein the thin-film transistor includes a thin-film transistor having a semiconductor layer formed of oxide semiconductor.

11. The display device according to claim 1, wherein each of the plurality of light-emitting functional layers is an organic electroluminescence layer.

* * * * *